(12) United States Patent
Tucker

(10) Patent No.: US 7,351,637 B2
(45) Date of Patent: Apr. 1, 2008

(54) SEMICONDUCTOR TRANSISTORS HAVING REDUCED CHANNEL WIDTHS AND METHODS OF FABRICATING SAME

(75) Inventor: Jesse Berkley Tucker, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 147 days.

(21) Appl. No.: 11/400,842

(22) Filed: Apr. 10, 2006

(65) Prior Publication Data

US 2007/0238253 A1   Oct. 11, 2007

(51) Int. Cl.
*H01L 21/336* (2006.01)
*H01L 21/8222* (2006.01)
*H01L 21/425* (2006.01)

(52) U.S. Cl. .............. 438/289; 438/302; 438/311; 438/370; 438/525; 438/527; 257/E21.345; 257/E21.427

(58) Field of Classification Search ............... 438/289, 438/302, 311, 370, 525, 527; 257/E21.345, 257/E21.427
See application file for complete search history.

(56) References Cited

U.S. PATENT DOCUMENTS

| | | | | |
|---|---|---|---|---|
| 5,376,566 | A | * | 12/1994 | Gonzalez ............ 438/253 |
| 5,439,835 | A | * | 8/1995 | Gonzalez ............ 438/241 |
| 5,705,410 | A | * | 1/1998 | Guegan ............... 438/302 |
| 6,337,504 | B1 | * | 1/2002 | Isobe et al. .......... 257/384 |
| 6,372,559 | B1 | | 4/2002 | Crowder et al. |
| 2003/0122164 | A1 | | 7/2003 | Komatsu |
| 2004/0188755 | A1 | | 9/2004 | Tarui et al. |
| 2005/0029568 | A1 | | 2/2005 | Tokuda et al. |
| 2007/0148893 | A1 | * | 6/2007 | Josiek et al. ......... 438/370 |

FOREIGN PATENT DOCUMENTS

JP          403048427 A   *   3/1991

OTHER PUBLICATIONS

Y. Fong, G. C. Liang T. Van Duzer, & C. Hu; "Channel Width Effect on MOSFET Breakdown"; IEEE Transactions on Electron Devices, vol. 39, No. 5 May 1992; pp. 1265-1267.

* cited by examiner

*Primary Examiner*—Walter Lindsay, Jr.
*Assistant Examiner*—Mohsen Ahmadi
(74) *Attorney, Agent, or Firm*—Fletcher Yoder

(57) ABSTRACT

A method of forming a channel in a semiconductor device including forming an opening in a masking layer to expose a portion of an underlying semiconductor layer through the opening is provided. The method further includes disposing a screening layer and implanting a first type of ions in the portion of the underlying semiconductor layer through the screening layer and through the opening in the masking layer. A second type of ions are implanted in the portion of the underlying semiconductor layer through the screening layer and through the opening in the masking layer at an oblique ion implantation angle wherein a lateral spread of second type ions is greater than a lateral spread of first type ions. Semiconductor devices fabricated in accordance to above said method is also provided.

21 Claims, 5 Drawing Sheets

SEMICONDUCTOR TRANSISTORS HAVING REDUCED CHANNEL WIDTHS AND METHODS OF FABRICATING SAME

BACKGROUND

The invention relates generally to semiconductor devices and in particular to semiconductor transistor devices having reduced channel widths and methods of fabricating same.

As will be appreciated, transistors, such as MOSFETs (metal oxide field effect transistors), generally include a number of layers wherein many doped regions are formed. Unlike silicon-based devices, wherein doped regions are typically formed by diffusion, the doped regions in silicon carbide (SiC) based devices are generally formed through ion implantation. Thus, for certain devices, such as SiC-based devices, the formation of the various doped regions is achieved through ion implantation which may be conducted through one or more openings formed through a series of lithography steps.

For instance, for a power MOSFET device, the channel formation typically involves the deposition and patterning of at least two photolithographic layers. Specifically, in conventional techniques, a P-type well is formed in an N-epitaxial drift region by employing a first photolithographic process. As will be appreciated, this photolithographic process generally involves disposing a masking layer, such as a photoresist, and patterning the layer to expose a portion of the underlying N-epitaxial drift region. The P-type well may then be formed through the opening by ion implantation, using a p-type dopant, such as boron or aluminum. As will be appreciated, the structure of a power MOSFET provides for an N+ doped source region to be surrounded by the P-type well region to form a channel for the MOSFET. The N+ doped source region is generally formed by employing a second photolithographic process, employing another masking layer which is disposed and patterned to provide an opening such that the N+ doped source region can be formed through ion implantation, for instance.

Disadvantageously, relying on the alignment of multiple lithography steps to form the channel of a power MOSFET limits the manufacturability of the channel. Specifically, channel dimensions are generally set on the order of 1 micron or greater to account for any misalignments caused by employing multiple lithography processes. Accordingly, channel widths formed using conventional lithography steps and multiple masking layers generally result in devices designed to have channel widths sufficiently greater than 1 micron, in order to fall within conventional tolerance limits. Disadvantageously, larger channel dimensions cause a higher on-state resistance of the device, as well as higher power dissipation.

Therefore there is a need to reduce the number of steps involved in fabrication and to reduce the channel dimension of power MOSFET devices. Accordingly, a technique is needed to address one or more of the foregoing problems in the fabrication of semiconductor devices.

BRIEF DESCRIPTION

In accordance with an embodiment of the invention, a method of forming a channel in a semiconductor device is provided. The method includes forming an opening in a masking layer to expose a portion of an underlying semiconductor layer through the opening. The method further includes disposing a screening layer over the masking layer and over the portion of the underlying semiconductor layer through the opening, and implanting a first type of ions in the portion of the underlying semiconductor layer through the screening layer and through the opening in the masking layer. The method further includes implanting a second type of ions in the portion of the underlying semiconductor layer through the screening layer and through the opening in the masking layer at an oblique ion implantation angle wherein a lateral spread of the second type of ions is greater than a lateral spread of the first type of ions.

In yet another embodiment of the invention, a method of fabricating a semiconductor device including disposing a masking layer over a substrate is provided. The method includes patterning the masking layer to form an opening therethrough, and disposing a screening layer over the patterned masking layer, wherein the screening layer comprises a thickness. The method further includes implanting a first type of ions in the substrate through the screening layer and forming a channel by implanting a second type of ions through the screening layer at an oblique ion implantation angle.

According to embodiments of the invention, a method of forming a transistor channel is provided. The method includes implanting n-type dopants into a semiconductor layer to form an N+ doped source region, wherein the n-type dopants are implanted through an opening in a masking layer and through a screening layer disposed in the opening. The method further includes implanting p-type dopants into the semiconductor layer to form a P-type well region around the N+ doped source region, wherein the p-type dopants are implanted through the opening in the masking layer and through the screening layer disposed in the opening.

In one embodiment of the invention, a semiconductor device having at least one semiconductor layer and a patterned masking layer over the at least one semiconductor layer is provided. The patterned masking layer has an opening therethrough wherein the opening has a first width. The device further includes a screening layer over the at least one semiconductor layer and the patterned masking layer wherein the screening layer is in a range of about 100 Å to about 7000 Å. The device further includes a first ion implanted region in the at least one semiconductor layer arranged below the opening, wherein the first ion implanted region includes a second width that is less than or equal to the first width, and a second ion implanted region in the at least one semiconductor layer arranged below the opening and around the first ion implanted region, wherein the second ion implanted region includes a third width that is greater than the second width.

In another embodiment of the invention, a semiconductor device having at least one semiconductor layer and at least one implanted region of a first type of ions in the at least one semiconductor layer is provided. The semiconductor device further includes a channel formed by ion implantation of a second type of ions, wherein the channel is a graded channel having a substantially higher concentration of the second type of ions at a first side of the channel than at a second side of the channel.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

A typical metal oxide field effect transistor (MOSFET) includes a source region, a drain region and a gate. Similarly, the related insulated gate bipolar transistor (IGBT) includes an emitter, a collector and a base, respectively, corresponding to the components of a MOSFET. In these devices, the source region or the drain region, and the emitter or the collector, are differently doped than an underlying semiconductor layer/substrate. In other words, if the source region is doped with n-type dopants then the underlying semiconductor layer is doped with p-type dopants. Typically, the doping may be performed through multiple lithography steps including a diffusion process whereby the respective dopants are diffused in the semiconductor layer/substrate selectively by making use of more than one masking layer. As the diffusion coefficients of the dopants in silicon carbide (SiC) are negligible, diffusion may not be a viable option for fabrication of devices based on silicon carbide. Alternatively, ion implantation may be employed to dope the semiconductor to form source or drain regions and the underlying differently doped semiconductor layer. Advantageously, ion implantation gives a better control over the process than a typical diffusion process.

According to embodiments of the present invention, a single lithography step is performed to form the source or drain region and the underlying oppositely doped semiconductor layer, as will be described further below. Although the following description illustrates a MOSFET device with an N+ doped source region, there are other related devices that may be made using embodiments of the present invention. For example, a MOSFET with P+ doped source region may be fabricated by reversing the doping of the source region of the illustrated MOSFET device. Further, an insulated gate bipolar transistor (IGBT) device may be made similarly, wherein the emitter of the IGBT device is oppositely doped as the collector of the IGBT device.

Figure 1:
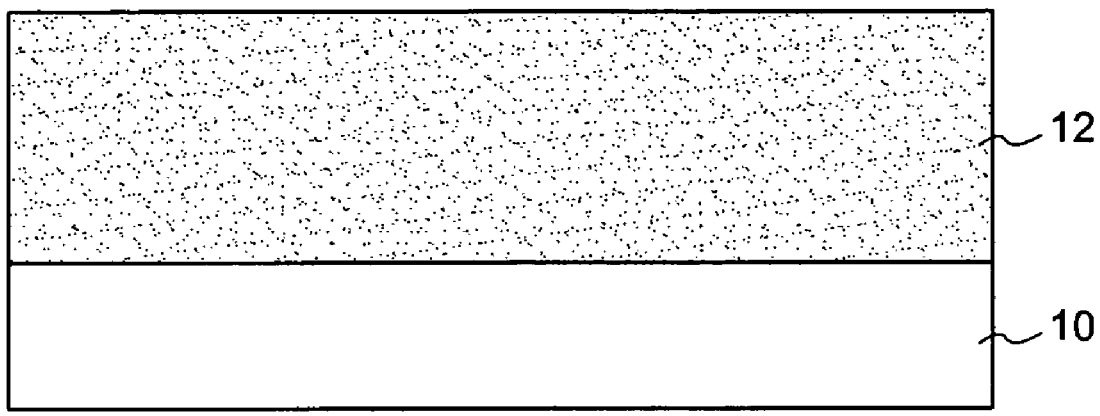
FIG. 1-8 are cross-sectional side views of the fabrications stages of a vertical silicon carbide-based metal oxide field effect transistor, in accordance with embodiments of the present invention.

Turning now to the figures, FIGS. 1-8 illustrate an exemplary process for fabricating a MOSFET having an N+ doped source region, according to certain embodiments of the present invention. Specifically, FIG. 1 is a cross-sectional side view of a semiconductor layer 10 having an epitaxial layer 12 disposed thereon. The semiconductor layer 10 may be a semiconductor substrate on which other materials are formed, disposed and/or patterned. Alternatively, semiconductor layer 10 may be an intermediate layer of a device being fabricated on an underlying substrate. The semiconductor layer 10 may be a semiconductor material such as, silicon, silicon carbide, aluminum nitride, sapphire, or gallium nitride, for example. Further, the semiconductor layer 10 may be a polytype of silicon carbide, such as 4H SiC, or 6H SiC polytypes. The semiconductor layer 10 may be p-type doped, or n-type doped or even undoped. In the illustrated embodiment, the semiconductor layer 10 is of 4H SiC polytype. The semiconductor layer 10 may have a thickness of about 550 microns and an impurity concentration of about $5\times10^{18}$ atoms/cm$^3$, for example. In certain embodiments, the thickness of the semiconductor layer 10 may be in a range of about 200 microns to about 600 microns. In some embodiments, the impurity concentration may be in a range of about $5\times10^{18}$ atoms/cm$^3$ to about $5\times10^{19}$ atoms/cm$^3$.

As illustrated in FIG. 1, the epitaxial layer 12 is disposed on the semiconductor layer 10. The epitaxial layer 12 may be of silicon, silicon carbide, aluminum nitride, sapphire, or gallium nitride. Further, the epitaxial layer 12 may be a polytype of silicon carbide, such as 4H SiC, or 6H SiC polytypes. In the illustrated example of the MOSFET having the N+ doped source region, the epitaxial layer 12 is n-type doped with n-type dopants such as nitrogen, phosphorus, arsenic, antimony, or any combinations thereof As will be appreciated, for a MOSFET having a P+ doped source region the epitaxial layer 12 may be doped with p-type dopants including boron, aluminum, gallium, magnesium, carbon, calcium, or any combinations thereof The dopants may be introduced during the formation of the epitaxial layer 12, for example. In some embodiments, a deposition technique such as, chemical vapor deposition (CVD) may be performed to form the epitaxial layer 12. The epitaxial layer 12 may have a doping concentration in a range of about $5\times10^{15}$ atoms/cm$^3$ to about $5\times10^{16}$ atoms/cm$^3$. In one embodiment, the epitaxial layer 12 is about 12 microns thick and is of 4H SiC with an n-type doping level of about $1\times10^{16}$ atoms/cm$^3$.

Figure 2:
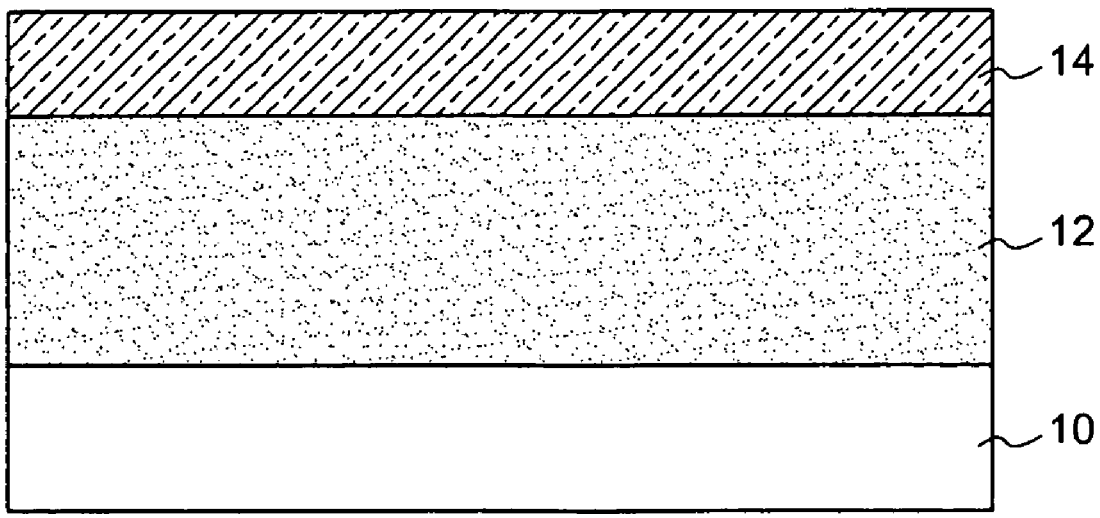

Referring now to FIG. 2, a cross-sectional side view of a masking layer 14 disposed on the epitaxial layer 12, is illustrated. In some embodiments, the masking layer 14 may be a photoresist. In certain embodiments, the masking layer 14 may be of carbon, silicon dioxide, silicon nitride, aluminum nitride or sapphire, for example. According to some embodiments, the masking layer 14 may be formed by thermal oxidation of the epitaxial layer 12. Alternatively, the masking layer 14 may be formed by deposition techniques such as chemical vapor deposition. As will be appreciated, the masking layer 14 may function as a protective layer for the underlying semiconductor layer 10 and the epitaxial layer 12, from damages that may result from further downstream processes involved in the fabrication of the MOSFET device, as described further below. Some of the downstream processes may include processing at very high temperature of the order of about 1000° C., or greater, and the masking layer 14 may protect the underlying semiconductor layer 10 at high temperatures. The thickness of the masking layer 14 may vary depending on the downstream processing employed. In certain embodiments, the masking layer 14 may have a thickness of about 5000 Å to about 20,000 Å. In one embodiment, the masking layer 14 is of silicon dioxide which is deposited to a thickness of about 10,000 Å.

Figure 3:
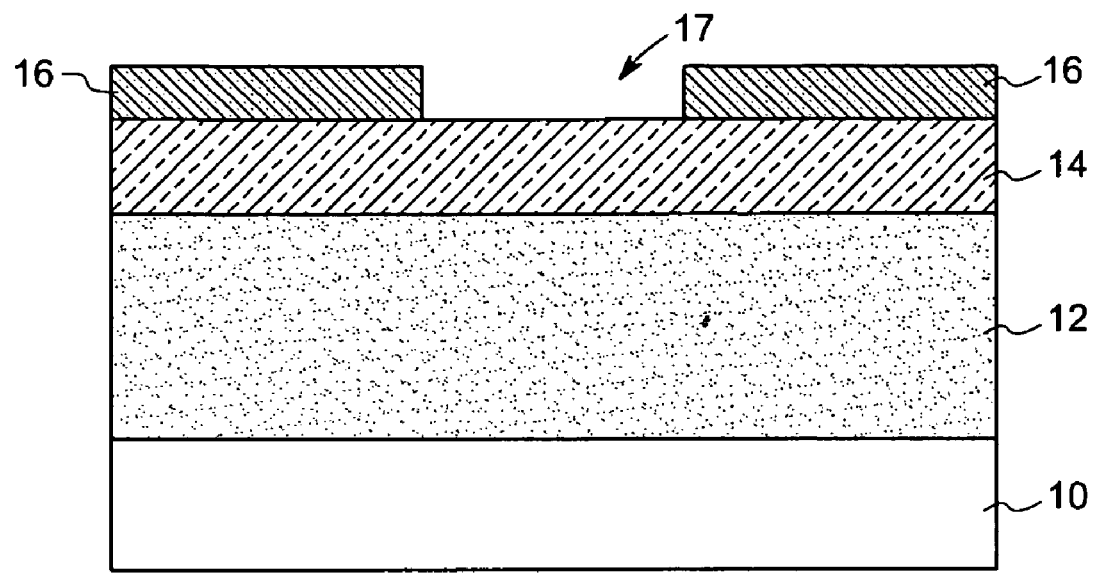

FIG. 3 depicts a photoresist layer 16 disposed on the masking layer 14 and subsequently patterned to form an opening 17. The photoresist may be disposed and patterned through techniques known in the art, to form the patterned photoresist layer 16 over the masking layer 14. The pattern of the photoresist layer 16 includes an opening 17 corresponding to a future position of a source region in the underlying epitaxial layer 12, as will be described further below. In some embodiments, the patterned photoresist layer 16 may include more than one opening 17 corresponding to source regions that may correspond to a single device or a series of devices.

Figure 4:
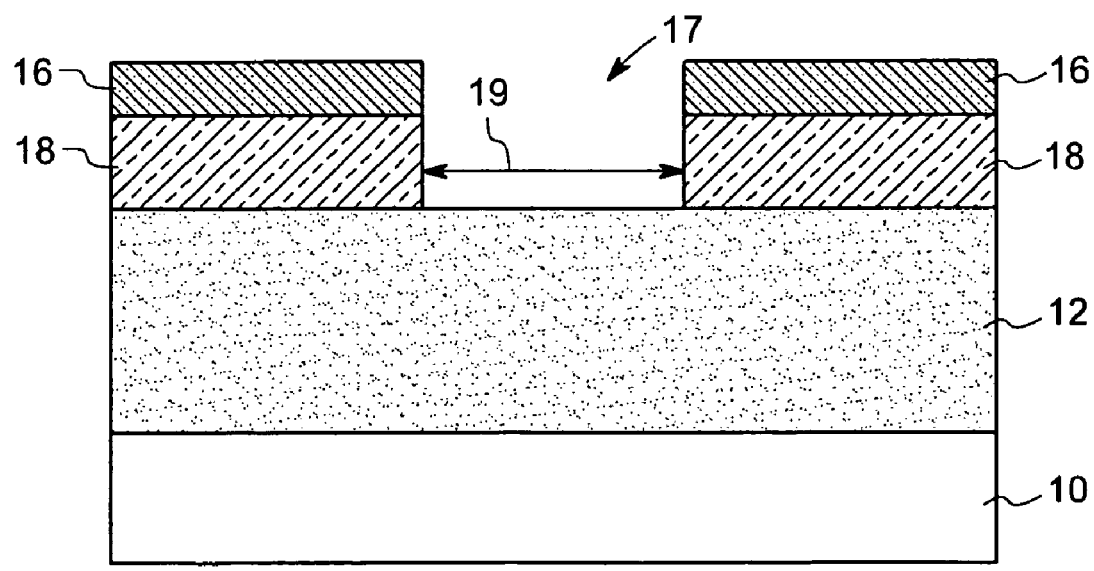

The underlying masking layer 14 is etched through the opening 17 of the patterned photoresist layer 16 to form a patterned masking layer 18, as illustrated in FIG. 4. The opening 17 extending through the patterned masking layer 18 exposes a portion of the epitaxial layer 12. The opening 17 may be defined by a width 19. As used herein, the width 19 defined by the width of the opening in the masking layer 18 may also be referred to as an "initial opening width". The patterned masking layer 18 may include more than one opening 17 corresponding to future source regions.

Figure 5:
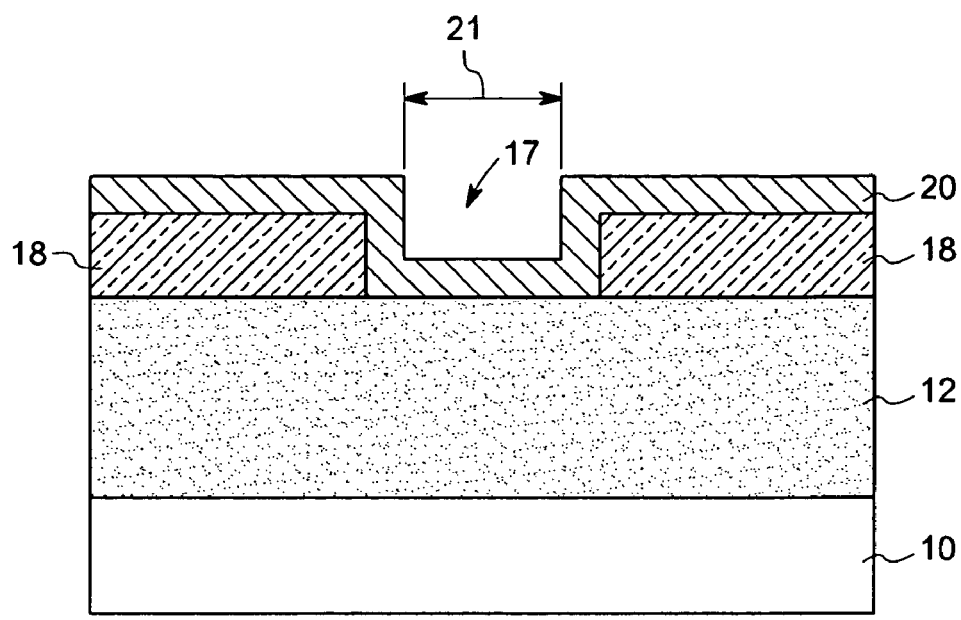

Following the formation of the patterned masking layer 18, the patterned photoresist layer 16 is removed. A screening layer 20 is disposed on the patterned masking layer 18 and the portion of the exposed epitaxial layer 12, as shown in FIG. 5. The screening layer 20 may be a photoresist. In certain embodiments, the screening layer 20 may be of carbon, silicon dioxide, silicon nitride, sapphire, or aluminum nitride. The formation of the screening layer 20 may be through thermal oxidation while in certain other embodiments, deposition techniques such as CVD may be employed to form the screening layer 20. Further, the screening layer 20 may be able to withstand temperatures greater than about 1000° C.

Because the screening layer 20 is disposed within the opening 17, the initial opening width 19 of the opening 17 (as shown in FIGS. 3 and 4) becomes narrower, as indicated by the "narrowed opening width" 21. The screening layer 20 is disposed uniformly over the patterned masking layer 18 and the exposed portion of the epitaxial layer 12, at a desirable thickness. According to certain embodiments of the invention, the thickness of the screening layer 20 is varied to adjust a channel dimension of the device, as will be described and illustrated further with respect to FIGS. 7-8. In some embodiments, the thickness of the screening layer 20 is in a range of about 100 Å to about 7000 Å. In one embodiment, the thickness is in a range of about 1000 Å to about 4000 Å.

Figure 6:
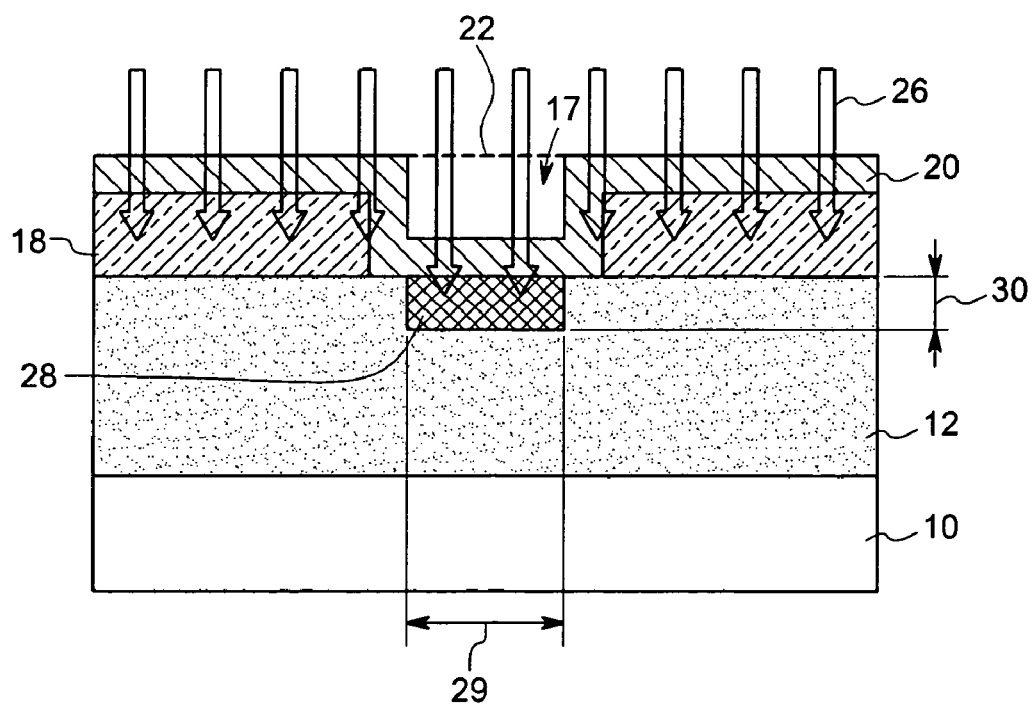

After deposition of the screening layer 20, ions are implanted into the structure. FIG. 6 depicts an ion implantation step employing a first type of ions to form a first implanted region 28 in the portion of the epitaxial layer 12 exposed through the reduced opening 17 having the narrowed opening width 21 in the screening layer 20. The first type of ions are implanted through the screening layer 20 to form the first implanted region 28 underlying the opening 17. As illustrated in the figure, block arrows 26 indicate the direction and angle at which the first type of ions impinge a plane 22 of the screening layer 20. As used herein, the "angle of ion implantation" corresponds to an angle at which the ions impinge the plane 22 of the screening layer 20. The block arrows 26, as indicated in FIG. 6, are at an angle normal to the plane 22 or approximately normal to the plane 22 of the screening layer 20. In other words, the angle of ion implantation is at about 90 degrees or approximately 90 degrees. The first implanted region 28 is defined by a first implantation width 29 and a thickness 30. As will be appreciated, the first implantation width 29 of the first implanted region 28 is a function of the narrowed opening width 21 of the opening 17, reduced by the deposition of the masking layer 20. In one embodiment, the first implantation width 29 of the first implanted region 28 is about or less than about the narrowed opening width 21 of the opening 17. The thickness 30 of the first implanted region 28 may depend on the energy at which the first type of ions are implanted, mass of the first type of ions, and on the properties of the material constituting the screening layer 20 and the epitaxial layer 12. Such properties may include an implantation range of the first type of ions through the material constituting the screening layer 20 and the epitaxial layer 12, and also the density of these materials. In one embodiment, the first type of ions are implanted at an energy in a range of about 15 keV to about 300 keV. In some embodiments, the concentration of the first type of ions in the first implanted region 28 is in a range of about $5 \times 10^{18}$ cm$^{-3}$ to about $4 \times 10^{19}$ cm$^{-3}$.

Figure 7:
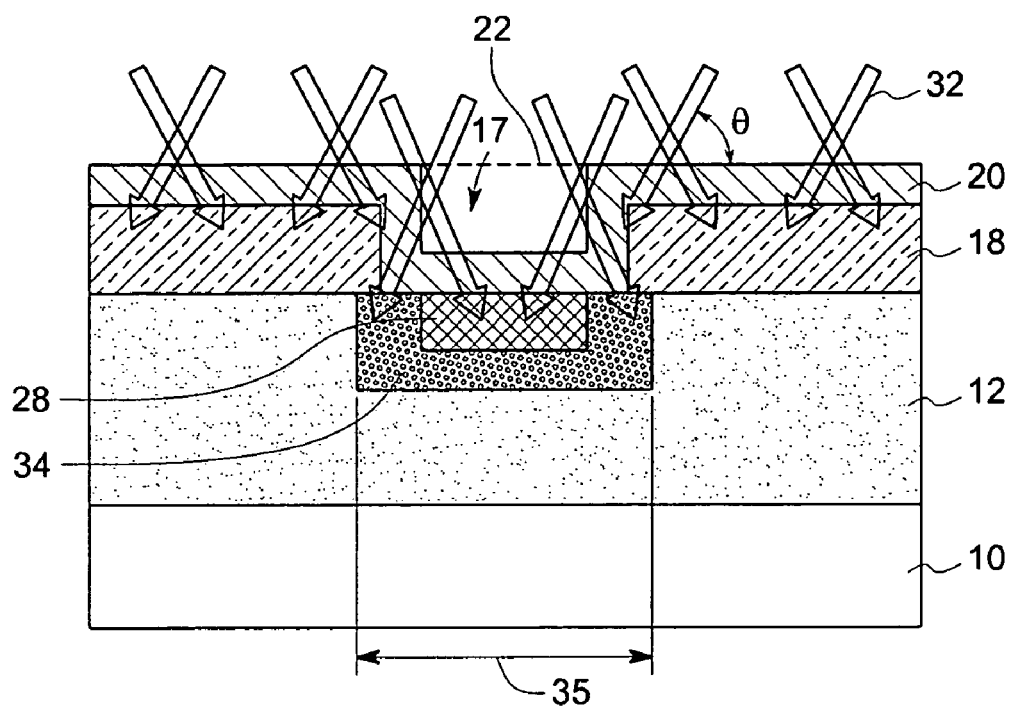

In the illustrated embodiment of a MOSFET having the N+ doped source region, the first type of ions include n-type dopants such as, nitrogen, phosphorus, arsenic, antimony or any combinations thereof As will be appreciated, for a MOSFET having a P+ type source region, the first type of ions include p-type dopants. Example p-type dopants include boron, aluminum, gallium, magnesium, carbon, calcium or any combinations thereof Next, the epitaxial layer 12 along with the patterned masking layer 18 and the screening layer 20 is subjected to a second implantation step employing a second type of ions, as shown in FIG. 7. As illustrated in the figure, block arrows 32 make an angle "θ", to the plane 22 of the screening layer 20. The angle "θ" is at an oblique angle to the plane 22 of the screening layer 20. In other words, the second type of ions impinge the screening layer 20 at an oblique angle of ion implantation or "oblique ion implantation angle." The second type of ions impinge the plane 22 of the screening layer 20 and the exposed portion of the epitaxial layer 12 at an oblique ion implantation angle, as shown by the block arrows 32, to form a second implanted region 34. The second implanted region 34 is formed below the opening 17, and around the first implanted region 28. In one embodiment, the oblique ion implantation angle is less than about 90 degrees. In some embodiments, the oblique ion implantation angle is in a range of about 30 degrees to about 60 degrees. In certain embodiments, the oblique ion implantation angle is about 45 degrees. In certain other embodiments, the oblique ion implantation angle is less than about 45 degrees.

In one embodiment, the second type of ions include p-type dopants such as, boron, aluminum, gallium, magnesium, carbon, calcium or any combinations thereof As will be appreciated, for a MOSFET having a P+ type source region, the second type of ions include n-type dopants. Example n-type dopants include nitrogen, phosphorus, arsenic, antimony or any combinations thereof.

The second implanted region 34 is defined by a second implantation width 35. The second implantation width 35 of the second implanted region 34 may be a function of the properties of the screening layer 20, properties of the epitaxial layer 12, the cosine of the angle of ion implantation, and the energy and mass of the second type of ions. The properties of the screening layer 20 and the epitaxial layer 12 that may decide the second implantation width 35 of the second implanted region 34 includes the implantation range and the density of the material constituting the screening layer 20 and the epitaxial layer 12, respectively. In other words, for a given set of screening layer 20 and epitaxial layer 12, implanting the second type of ions at different oblique ion implantation angles may control the second implantation width 35 of the second implanted region 34. As illustrated in the figure, the second implanted region 34 may extend into a portion of the epitaxial layer 12 under the patterned masking layer 18. In other words, the lateral spread of the second type of ions is greater than the lateral spread of the first type of ions due to implantation of the former at the oblique angle of ion implantation. In one embodiment, a ratio of the lateral spread of the first type of ions to the lateral spread of the second type of ions is about 1:5. As will be appreciated, the second implantation width 35 of the second implanted region 34 may be greater than the first implantation width 29 of the first implanted region 28.

In one embodiment, the second implantation width 35 of the second implanted region 34 is also greater than the narrowed opening width 21 of the opening 17, reduced by the deposition of the masking layer 20.

In some embodiments, the energy at which the second type of ions are implanted is in a range of about 15 keV to about 3 MeV. A concentration of the second type of ions in the second implanted region 34 may be in a range of about $5 \times 10^{16}$ cm$^{-3}$ to about $4 \times 10^{17}$ cm$^{-3}$.

The implantation of the second type of ions around the first type of ions may form a channel of the device within the second implanted region 34. The second implanted region 34 is a graded region since a concentration of the second type of ions may be higher at a point of incidence than at a farthest point from the point of incidence. As used herein, the term "point of incidence" corresponds to a point on a surface of the epitaxial layer 12 wherein the ions impinge.

Figure 8:
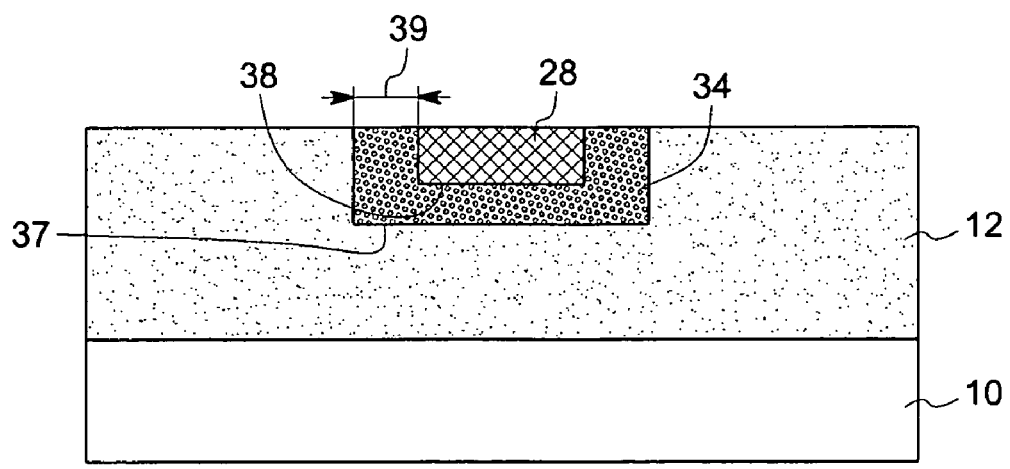

The screening layer 20 and the patterned masking layer 18 are removed after the second implantation step. FIG. 8 illustrates the channel of the device with a first side 37 and a second side 38. An outer surface of the second implanted region 34 facing the epitaxial layer 12 is referred to as the "first side" 37. The first side 37 extends along the surface of the well-shaped second implanted region 34. Similarly, an inner surface of the first implanted region 28 facing the well-shaped second implanted region 34 is referred to as the "second side" 38. The second side 38 may have ions corresponding to the first type of ions. The second type of ions are implanted deeper in the epitaxial layer 12 due to oblique angle of ion implantation and hence the first side 37 is mostly of the second type of ions. The channel of the device may be defined as the region having negligible first type of ions and is mostly of the second type of ions. According to embodiments of the invention, a graded channel with substantially higher concentration of the second type of ions at the first side 37 of the channel than at the second side 38 of the channel is formed. As used herein, the term "substantially" means about or greater than about 10 percent. As will be appreciated, according to some embodiments, a channel width 39 may be controlled by changing the thickness of the screening layer 20. The thickness of the screening layer 20 offsets the first type of ions from the second type of ions within the second implanted region 34. In other words, the channel width 39 is a function of the thickness of the screening layer 20. In one embodiment, the channel dimension or channel width 39 is in a range of about 2,000 Å to about 10,000 Å.

Following the channel formation other components (not shown) such as a gate oxide, gate contacts, source contacts, drain region, drain contacts, ohmic contacts or additional layers such as passivation layers may be added to form the MOSFET device, as will be appreciated by those skilled in the art.

Figure 9:
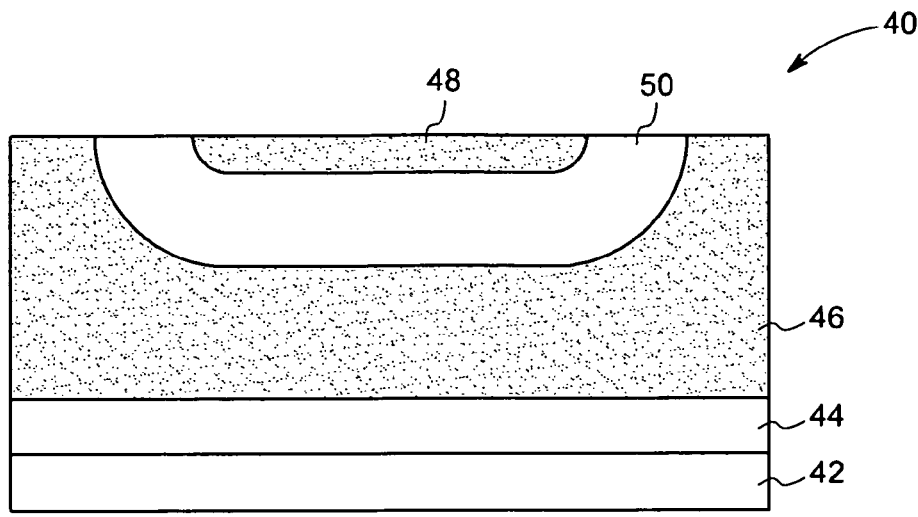
FIG. 9 is a cross-sectional side view of an insulated gate bipolar transistor (IGBT), in accordance with an embodiment of the present invention.

FIG. 9 is an exemplary IGBT device 40 fabricated, in accordance with embodiments of the present invention. The IGBT device 40 includes a P+ doped collector layer 42, an N+ doped buffer layer 44, an N− doped drift region 46, a P-type well region 50 and an N+ emitter region 48. According to embodiments of the present invention, a single lithography step is performed to form the N+ emitter region 48 and the P-type well region 50. As described previously, a masking layer and a screening layer are employed to form the N+ emitter region 48 and the P-type well region 50.

Figure 10:
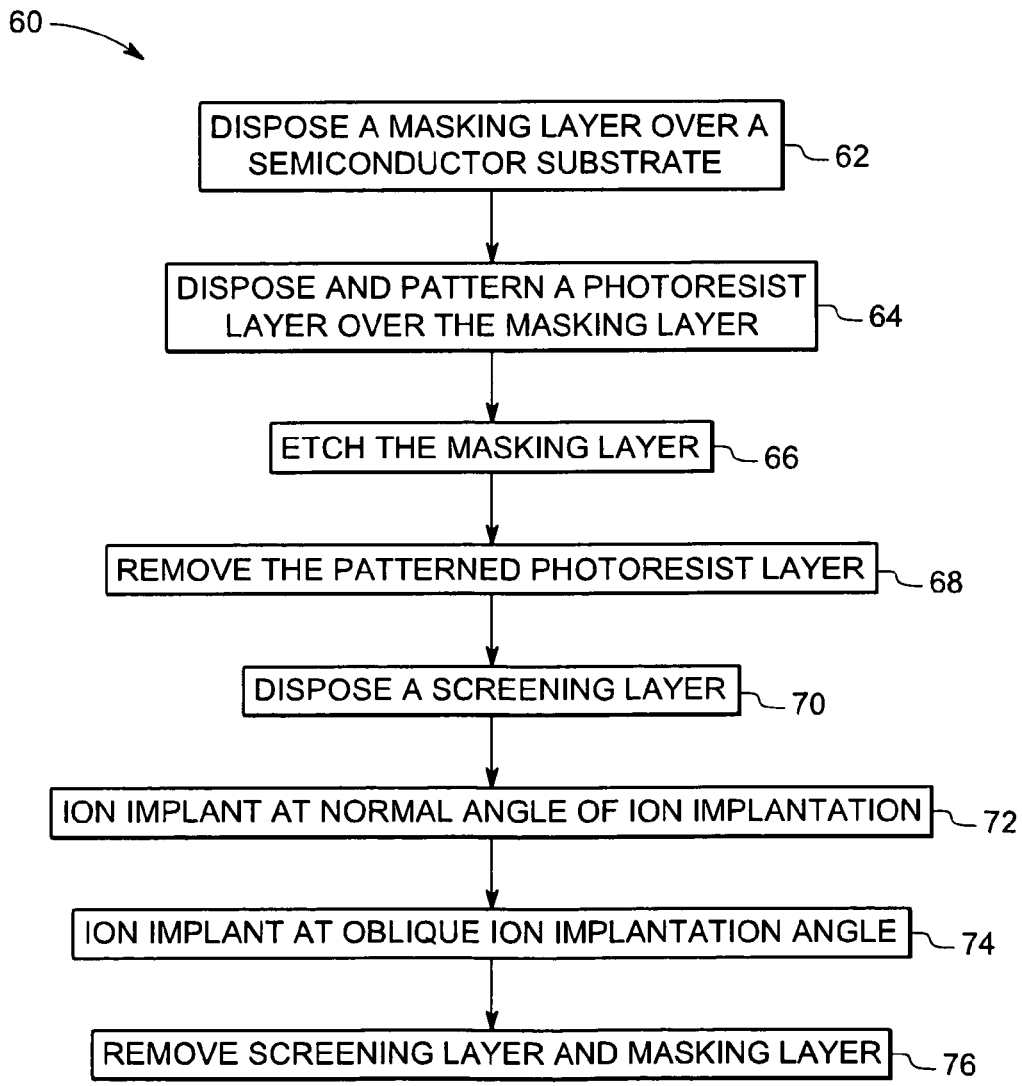
FIG. 10 is a flow chart of a method of making a semiconductor device, according to embodiments of the invention.

Turning now to FIG. 10, a flow chart 60 depicting a method of forming a semiconductor device, according to exemplary embodiments of the invention is illustrated. A semiconductor substrate comprising a semiconductor material is provided. The semiconductor material may comprise one of silicon, silicon carbide, aluminum nitride, sapphire, or gallium nitride and further may be n-type doped, p-type doped or undoped. Further, the semiconductor substrate material may be a polytype of silicon carbide, such as 4H SiC, or 6H SiC polytypes. As previously described, the semiconductor substrate may comprise a wafer, or it may comprise a structure having a number of layers such as an epitaxial layer, a drift layer and the like.

At step 62, a masking layer is disposed on the semiconductor substrate. The masking layer may be a photoresist material. In some embodiments, the masking layer may be of carbon, silicon oxide, silicon nitride, sapphire, or aluminum nitride and in one embodiment, is formed by thermal oxidation of the semiconductor substrate. Alternatively, the masking layer may be formed by the deposition of one of silicon oxide, silicon nitride, sapphire, or aluminum nitride. The masking layer may be formed of a thickness so as to protect the underlying semiconductor substrate from damages from further fabrication processes.

A photoresist layer is disposed over the masking layer at step 64. The photoresist layer in one embodiment is formed by spin coating a photoresist material over the masking layer. The applied photoresist layer is patterned using standard techniques. In one embodiment, the photoresist layer is selectively exposed to UV radiation to harden the exposed region of the photoresist layer. Subsequently, the photoresist layer is treated with a developing solution resulting in an opening, or openings as desired.

The masking layer is then etched through the opening in the patterned photoresist layer, at step 64. As a result of the etching, a portion of the underlying semiconductor substrate is exposed through the opening in the masking layer. The etching of the masking layer is conducted through standard techniques. For example, a masking layer comprising silicon oxide is etched, in one embodiment, using an etching solution including hydrofluoric acid which preferentially etches the masking layer while leaving the underlying semiconductor substrate untouched. At step 68, the patterned photoresist layer is removed leaving the patterned masking layer over the semiconductor substrate.

A screening layer is disposed on the patterned masking layer and over the exposed portion of the semiconductor substrate. The screening layer comprising one of silicon dioxide, silicon nitride, sapphire, or aluminum nitride, in one embodiment, is disposed using deposition techniques such as CVD. In some embodiments, the screening layer is a photoresist material. In one embodiment, the screening layer may have a thickness in a range of about 100 Å to about 7000 Å.

At step 72, a first type of ions are implanted in the exposed portion of the semiconductor substrate through the screening layer. The implantation of the first type of ions may form a first implanted region in the exposed portion of the semiconductor substrate underlying the opening of the masking layer. As described previously, the first type of ions are implanted at an angle normal to a plane of the screening layer. The first type of ions may comprise n-type dopants such as, nitrogen, phosphorus, arsenic, antimony or any combinations thereof In some embodiments, the first type of ions include p-type dopants such as, boron, aluminum, gallium, magnesium, carbon, calcium, or any combinations thereof.

In one embodiment, the semiconductor substrate including the patterned masking layer and the screening layer is placed on a rotating base plate and the first type of ions are implanted at an energy in the range of about 15 keV to about 300 keV so as to form homogeneously, the first implanted region. The concentration of the implanted ions in the first implanted region may be in a range of about $5 \times 10^{18}$ cm$^{-3}$ to about $4 \times 190^{19}$ cm$^{-3}$.

The first implanted region may be defined by a first implantation width and a thickness. In one embodiment, the first implantation width of the implanted region is about or less than about the width of the opening in the patterned masking layer. The thickness of the implanted region may be correlated to an energy at which the ions are implanted, the mass of the ions, and the properties of the material constituting the screening layer and the semiconductor substrate.

At step 74, a second type of ions are implanted in the semiconductor substrate through the screening layer to form a second implanted region. The second type of ions are implanted at an oblique ion implantation angle to form a second implanted region around the first implanted region. As a result of the implantation at an oblique angle of implantation the lateral spread of the second type of ions are greater than the lateral spread of the first type of ions.

In one embodiment, the semiconductor substrate with the patterned masking layer and the screening layer is placed on a rotating base plate at an oblique angle to a plane of the base plate and the second type of ions are implanted. Alternatively, the semiconductor substrate with the patterned masking layer and the screening layer may be placed on a rotating base plate and the second type of ions are implanted at an oblique angle of implantation. In one embodiment, the semiconductor substrate is rotated at a speed of about 10 rotations per minute (RPM) to about 3000 RPM during ion implantation. The rotation of the sample helps in forming a homogenous second implanted region. In one embodiment, the energy at which the second type of ions are implanted is in a range of about 15 keV to about 3 MeV. A concentration of the second type of ions in the second implanted region may be in a range of about $5 \times 10^{16}$ cm$^{-3}$ to about $4 \times 10^{17}$ cm$^{-3}$.

The second type of ions may comprise n-type dopants such as, nitrogen, phosphorus, arsenic, antimony or any combinations thereof In one embodiment, the second type of ions include p-type dopants such as, boron, aluminum, gallium, magnesium, carbon, calcium, or any combinations thereof, as described previously.

The implantation of the second type of ions forms a channel of the device in the second implanted region. A second implantation width of the second implanted region or a channel width of the channel is a function of the oblique implantation angle as well as a thickness of the screening layer, the energy and mass of the implanted second type of ions, and the properties of the semiconductor substrate, as described previously. The channel of the device may be defined as the region having negligible first type of ions and is mostly of second type of ions. According to embodiments of the invention, a graded channel with substantially higher concentration of the second type of ions at a first side of the channel than at a second side of the channel is formed. The first side of the channel corresponds to an outward facing surface of the second implanted region and the second side of the channel corresponds to a surface of the first implanted region facing the second implanted region.

Following the channel formation, the patterned masking layer and the screening layer are removed, at step 76. In some embodiments, the patterned masking layer and the screening layer are wet-etched using an etchant such that there is no damage to the underlying semiconductor substrate. Further, components such as a gate oxide, gate contact, source contact, drain region, drain contact and additional layers may be added as desired to form the semiconductor device.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of forming a channel in a semiconductor device comprising:
   forming an opening in a masking layer to expose a portion of an underlying semiconductor layer through the opening;
   disposing a screening layer over the masking layer and over the portion of the underlying semiconductor layer through the opening;
   implanting a first type of ions in the portion of the underlying semiconductor layer through the screening layer and through the opening in the masking layer; and
   implanting a second type of ions in the portion of the underlying semiconductor layer through the screening layer and through the opening in the masking layer at an oblique ion implantation angle, wherein a lateral spread of the second type of ions is greater than a lateral spread of the first type of ions; and
   removing the screening layer after implantation of the second type of ions.

2. The method of claim 1, wherein disposing the screening layer comprises disposing an oxide layer, a metal layer or a nitride layer over the masking layer and over the portion of the underlying semiconductor layer.

3. The method of claim 1, wherein disposing the screening layer comprises disposing the screening layer at a thickness in the range of about 100 Å microns to about 7000 Å.

4. The method of claim 1, wherein the second type of ions comprise p-type dopants comprising boron, aluminum, gallium, magnesium, carbon, calcium, or any combinations thereof.

5. The method of claim 1, wherein the first type of ions comprise n-type dopants comprising nitrogen, phosphorus, arsenic, antimony, or any combinations thereof.

6. The method of claim 1, wherein a ratio of the lateral spread of the first type of ions to the lateral spread of the second type of ions is about 1:5.

7. The method of claim 1, wherein the oblique ion implantation angle is less than about 90 degrees.

8. The method of claim 1, wherein the oblique ion implantation angle is in a range of about 30 degrees to about 60 degrees.

9. The method of claim 1, wherein the oblique ion implantation angle is about 45 degrees.

10. The method of claim 1, wherein the oblique ion implantation angle is less than about 45 degrees.

11. A method of fabricating a semiconductor device comprising:
    disposing a masking layer over a substrate;
    patterning the masking layer to form an opening therethrough;
    disposing a screening layer over the masking layer and the substrate, wherein the screening layer comprises a thickness;
    implanting a first type of ions into the substrate through the screening layer and through the opening in the masking layer to form an N+ doped source region in the substrate; and forming a channel by implanting a second type of ions in the substrate through the screening layer and through the opening in the masking layer at an oblique ion implantation angle to form a P-type well region in the substrate.

12. The method of claim 11, wherein the channel is a graded channel, wherein a concentration of the second type of ions in the graded channel is greater at a first side of the channel than at a second side of the channel.

13. The method of claim 11, wherein a lateral spread of the second type of ions is greater than a lateral spread of the first type of ions.

14. The method of claim 11, wherein disposing the screening layer comprises disposing an oxide layer, a metal layer or a nitride layer over the masking layer and the substrate.

15. The method of claim 11, wherein disposing the screening layer comprises disposing the screening layer at a thickness in the range of about 100 Å to about 7000 Å.

16. The method of claim 15, wherein a width of the channel is a function of the thickness of the screening layer.

17. The method of claim 11, wherein the oblique ion implantation angle is in a range of about 30 degrees to about 60 degrees.

18. The method of claim 11, wherein the oblique ion implantation angle is about 45 degrees.

19. A method of forming a transistor channel comprising:
implanting n-type dopants in a semiconductor layer to form an N+ doped source region in the semiconductor layer at an angle of approximately 90 degrees with respect to a plane of the semiconductor layer, wherein the n-type dopants are implanted through an opening in a masking layer and through a screening layer disposed in the opening; and implanting p-type dopants in the semiconductor layer at an oblique angle with respect to the plane of the semiconductor layer to form a P-type well region around the N+ doped source region, wherein the p-type dopants are implanted through the opening in the masking layer and through the screening layer disposed in the opening.

20. A semiconductor device comprising:
at least one semiconductor layer;
a patterned masking layer over the at least one semiconductor layer, wherein the patterned masking layer has an opening therethrough, wherein the opening has a first width;
a screening layer over the at least one semiconductor layer and the patterned masking layer, wherein the screening layer is in a range of about 100 Å to about 7000 Å thick;
a first ion implanted region in the at least one semiconductor layer arranged below the opening, wherein the first ion implanted region comprises a second width that is less than or equal to the first width; and
a second ion implanted region in the at least one semiconductor layer arranged below the opening and around the first ion implanted region, wherein the second ion implanted region comprises a third width that is greater than the first width.

21. The semiconductor device of claim 20, wherein the at least one semiconductor layer comprises silicon carbide, silicon, aluminum nitride, sapphire, or gallium nitride.

* * * * *